United States Patent
Takamine

(10) Patent No.: US 9,912,318 B2
(45) Date of Patent: Mar. 6, 2018

(54) FILTER DEVICE AND DUPLEXER

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 85 days.

(21) Appl. No.: 14/963,315

(22) Filed: Dec. 9, 2015

(65) Prior Publication Data
US 2016/0094198 A1 Mar. 31, 2016

Related U.S. Application Data

(63) Continuation of application No. PCT/JP2014/055097, filed on Feb. 28, 2014.

(30) Foreign Application Priority Data

Jun. 13, 2013 (JP) ................................ 2013-124726

(51) Int. Cl.
*H03H 9/72* (2006.01)
*H03H 9/64* (2006.01)
(Continued)

(52) U.S. Cl.
CPC ............ *H03H 9/725* (2013.01); *H03H 9/008* (2013.01); *H03H 9/0028* (2013.01);
(Continued)

(58) Field of Classification Search
CPC .... H03H 9/0028; H03H 9/0057; H03H 9/008; H03H 9/0085; H03H 9/14588;
(Continued)

(56) References Cited

U.S. PATENT DOCUMENTS 5,994,980 A * 11/1999 Tada ..................... H03H 9/0028
310/313 R
7,046,102 B2 * 5/2006 Nakamura ........... H03H 9/0038
333/133
(Continued)

FOREIGN PATENT DOCUMENTS

JP 2003-234636 A * 8/2003
JP 2003-249842 A 9/2003
(Continued)

OTHER PUBLICATIONS

English language machine translation of JP 2008-118277 A, published May 22, 2008, 1-15 pages of detailed description and 1-4 pages of claims.*
(Continued)

*Primary Examiner* — Barbara Summons
(74) *Attorney, Agent, or Firm* — Keating & Bennett, LLP

(57) ABSTRACT

In a filter device, first and second filter sections are connected in parallel between an input terminal and an output terminal. The first filter section is a longitudinally coupled resonator-type elastic wave filter including first and second inter-stage wiring lines with a two-stage cascading connection. The second filter section is a longitudinally coupled resonator-type elastic wave filter including third and fourth inter-stage wiring lines with a two-stage cascading connection. The phases of signals flowing in the third inter-stage wiring line and the second inter-stage wiring line are inverse. Terminal portions of an interdigital transducer electrode connected to the second inter-stage wiring line and an interdigital transducer electrode connected to the third inter-stage wiring line that are connected to a potential that is not a hot-side potential are connected by a virtual ground wiring line. A hot-side wiring portion that is adjacent to the virtual
(Continued)

ground wiring line is disposed on an insulating film provided on the piezoelectric substrate.

10 Claims, 11 Drawing Sheets

(51) Int. Cl.
*H03H 9/00* (2006.01)
*H03H 9/54* (2006.01)
*H03H 9/70* (2006.01)
*H03H 9/145* (2006.01)

(52) U.S. Cl.
CPC ........ *H03H 9/0057* (2013.01); *H03H 9/0085* (2013.01); *H03H 9/54* (2013.01); *H03H 9/6433* (2013.01); *H03H 9/70* (2013.01); *H03H 9/14588* (2013.01); *H03H 9/6483* (2013.01)

(58) Field of Classification Search
CPC ...... H03H 9/54; H03H 9/6433; H03H 9/6483; H03H 9/70; H03H 9/725; H03H 9/02952; H03H 9/6469; H03H 9/6496
USPC .......... 333/133, 193–195; 310/313 B, 313 D
See application file for complete search history.

(56) References Cited

U.S. PATENT DOCUMENTS

| | | |
|---|---|---|
| 2004/0155730 A1 | 8/2004 | Iwamoto et al. |
| 2004/0196119 A1 | 10/2004 | Shibahara et al. |
| 2007/0018756 A1 | 1/2007 | Fujii et al. |
| 2009/0273409 A1 | 11/2009 | Okuda |
| 2013/0120084 A1 | 5/2013 | Bauer et al. |
| 2014/0368295 A1* | 12/2014 | Takamine .............. H03H 9/725 333/133 |

FOREIGN PATENT DOCUMENTS

| | | | |
|---|---|---|---|
| JP | 2004-282707 A | | 10/2004 |
| JP | 2005-294891 A | | 10/2005 |
| JP | 2007-174307 A | | 7/2007 |
| JP | 2007-259023 A | * | 10/2007 |
| JP | 2007-259430 A | | 10/2007 |
| JP | 2008-118277 A | | 5/2008 |
| JP | 2012-157078 A | | 8/2012 |
| WO | 2006/009021 A1 | | 1/2006 |
| WO | 2008/096514 A1 | | 8/2008 |
| WO | 2011/144664 A1 | | 11/2011 |

OTHER PUBLICATIONS

English language machine translaton of JP 2007-259023 A, published Oct. 4, 2007, 1-7 pages of detailed description.*
Official Communication issued in International Patent Application No. PCT/JP2014/055097, dated May 13, 2014.

* cited by examiner

FIG. 4 COMPARATIVE EXAMPLE

COMPARATIVE EXAMPLE

FILTER DEVICE AND DUPLEXER

BACKGROUND OF THE INVENTION

1. Field of the Invention

The present invention relates to a filter device including a plurality of elastic wave resonators provided on a piezoelectric substrate, and particularly relates to a filter device and a duplexer including a longitudinally coupled resonator-type elastic wave filter section.

2. Description of the Related Art

Longitudinally coupled resonator-type filter devices have thus far been widely used as reception filters of duplexers in cellular phones. There is strong demand for the miniaturization of longitudinally coupled resonator-type filter devices.

In Japanese Unexamined Patent Application Publication No. 2008-118277, first and second longitudinally coupled resonator-type filter sections, which are each formed by cascade-connecting two longitudinally coupled resonator-type elastic wave filter units, are connected in parallel. In other words, a longitudinally coupled resonator-type elastic wave filter device having a two-stage, four-element configuration is disclosed. In Japanese Unexamined Patent Application Publication No. 2008-118277, ground terminals of adjacent interdigital transducer electrodes in the first-stage longitudinally coupled resonator-type elastic wave filter units of the first and second longitudinally coupled resonator-type elastic wave filter sections are electrically connected by wiring lines. Accordingly, the wiring lines function as virtual ground wiring lines, where the wiring lines are not connected to a ground potential. Accordingly, it is not necessary to connect the virtual ground wiring lines to a ground potential. This makes it possible to achieve miniaturization.

In the case where the virtual ground wiring lines disclosed in Japanese Unexamined Patent Application Publication No. 2008-118277 are used, terminals, wiring lines, and the like for connecting to a ground potential can be omitted. Accordingly, a higher level of miniaturization can be achieved.

However, in a balanced elastic wave filter device, there has been a problem in that when a ground wiring line is used, large ripples appear in characteristics such as an amplitude difference, a phase difference, and so on in pairs of balanced terminals. Meanwhile, in an unbalanced elastic wave filter device, there has been a problem in that large ripples appear within a pass band when virtual ground wiring lines are used. Accordingly, virtual ground wiring lines have thus far not been used.

SUMMARY OF THE INVENTION

Preferred embodiments of the present invention provide a filter device that includes a virtual ground wiring line and significantly reduces or prevents a ripple appearing in a filter characteristic.

A filter device according to a first aspect of various preferred embodiments of the present application includes a piezoelectric substrate, an input terminal, an output terminal, and first and second filter sections provided on the piezoelectric substrate. The first filter section is connected between the input terminal and the output terminal. The second filter section is connected between the input terminal and the output terminal, and is connected in parallel to the first filter section.

In the first aspect, the first filter section includes a first longitudinally coupled resonator-type elastic wave filter unit, a second longitudinally coupled resonator-type elastic wave filter unit cascade-connected to the first longitudinally coupled resonator-type elastic wave filter unit, and first and second inter-stage wiring lines that connect the first longitudinally coupled resonator-type elastic wave filter unit and the second longitudinally coupled resonator-type elastic wave filter unit.

The second filter section includes a third longitudinally coupled resonator-type elastic wave filter unit, a fourth longitudinally coupled resonator-type elastic wave filter unit cascade-connected to the third longitudinally coupled resonator-type elastic wave filter unit, and third and fourth inter-stage wiring lines that connect the third and fourth longitudinally coupled resonator-type elastic wave filter units.

In the first aspect, the first filter section and the second filter section include a plurality of first terminal portions connected to a hot-side potential and a plurality of second terminal portions connected to a potential that is not the hot-side potential.

The filter device further includes a virtual ground wiring line that connects at least one of the plurality of second terminal portions in the first filter section and at least one of the plurality of second terminal portions in the second filter section.

In addition, in the first aspect, the filter device further includes a hot-side wiring portion that is adjacent to the virtual ground wiring line and an insulating film provided on the piezoelectric substrate. The hot-side wiring portion that is adjacent to the virtual ground wiring line is located on the insulating film.

A filter device according to a second aspect of various preferred of the present application includes a piezoelectric substrate, an input terminal, an output terminal, and first and second filter sections provided on the piezoelectric substrate. The first filter section is connected between the input terminal and the output terminal. The second filter section is connected between the input terminal and the output terminal, and is connected in parallel to the first filter section.

In the present aspect, the first filter section includes a first longitudinally coupled resonator-type elastic wave filter unit, a second longitudinally coupled resonator-type elastic wave filter unit cascade-connected to the first longitudinally coupled resonator-type elastic wave filter unit, and first and second inter-stage wiring lines that connect the first longitudinally coupled resonator-type elastic wave filter unit and the second longitudinally coupled resonator-type elastic wave filter unit.

The second filter section includes a third longitudinally coupled resonator-type elastic wave filter unit, a fourth longitudinally coupled resonator-type elastic wave filter unit cascade-connected to the third longitudinally coupled resonator-type elastic wave filter unit, and third and fourth inter-stage wiring lines that connect the third and fourth longitudinally coupled resonator-type elastic wave filter units.

In the second aspect, the first filter section and the second filter section include a plurality of first terminal portions connected to a hot-side potential and a plurality of second terminal portions connected to a potential that is not the hot-side potential.

The filter device further includes a virtual ground wiring line that connects at least one of the plurality of second terminal portions in the first filter section and at least one of the plurality of second terminal portions in the second filter section.

In the second aspect, the filter device further includes a hot-side wiring portion that bridges the virtual ground wiring line. An interlayer insulating film is further provided between the virtual ground wiring line and the hot-side wiring portion in the bridged area. A width of the virtual ground wiring line in the area bridged by the interlayer insulating film is narrower than a width of the rest of the virtual ground wiring line.

According to a specific aspect of the filter device according to a preferred embodiment of the present invention (the first and second aspects will be collectively referred to as a preferred embodiment of the present invention hereinafter), the virtual ground wiring line may electrically connect at least one of the second terminal portions in the second longitudinally coupled resonator-type elastic wave filter unit and at least one of the second terminal portions in the fourth longitudinally coupled resonator-type elastic wave filter unit.

In the filter device according to a preferred embodiment of the present invention, the input terminal may be an unbalanced input terminal and the output terminal may be an unbalanced output terminal. In other words, the filter device according to a preferred embodiment of the present invention may be an unbalanced filter device.

In addition, in the filter device according to a preferred embodiment of the present invention, the input terminal may be an unbalanced input terminal and the output terminal may be first and second balanced output terminals. In other words, the filter device according to a preferred embodiment of the present invention may be a balanced filter device.

The filter device according to a preferred embodiment of the present invention may further include at least one third filter section connected between the input terminal and the output terminal and connected in parallel to the first and second filter sections.

A duplexer according to another preferred embodiment of the present invention includes a first band-pass filter device including a filter device according to one of the preferred embodiments of the present invention and a second band-pass filter device, provided on the piezoelectric substrate, that is different from the first band-pass filter device.

According to various preferred embodiments of the present invention, the hot-side wiring portion that is adjacent to the virtual ground wiring line is located on the insulating film, or the width of the portion of the virtual ground wiring line is narrower than the width of the rest of the virtual ground wiring line at the area where the virtual ground wiring line and the hot-side wiring portion are bridged with the interlayer insulating film located therebetween, and thus a ripple appearing in the filter characteristic is effectively suppressed or prevented. Accordingly, not only can miniaturization be achieved by using the virtual ground wiring line, but a filter device having favorable characteristics is also provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear hereinafter through descriptions of specific preferred embodiments of the present invention with reference to the drawings.

Figure 1:
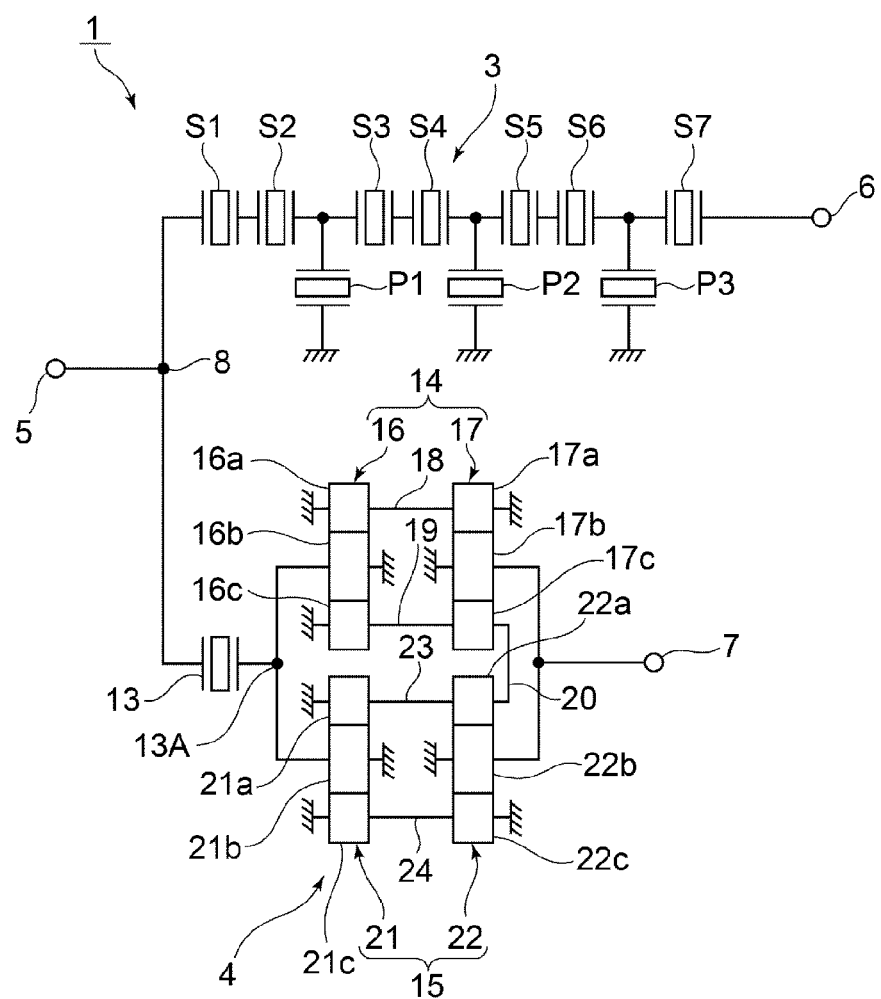
FIG. 1 is a circuit diagram illustrating a duplexer according to a first preferred embodiment of the present invention.

FIG. 1 is a circuit diagram illustrating a duplexer according to a first preferred embodiment of the present invention. A duplexer 1 is configured by forming electrode structures illustrated in FIG. 2 on a piezoelectric substrate 2, also illustrated in FIG. 2. Returning to FIG. 1, the duplexer 1 includes an antenna terminal 5, a transmission terminal 6, and a reception terminal 7. The antenna terminal 5 is connected to a common node 8. A transmission filter 3 is connected between the common node 8 and the transmission terminal 6. A reception filter 4 is connected between the common node 8 and the reception terminal 7.

The reception filter 4 embodies a filter device according to a preferred embodiment of the present invention. The transmission filter 3 and the reception filter 4 will be described in detail hereinafter.

The transmission filter 3 is a ladder filter. A plurality of serial arm resonators S1 to S7, including elastic wave resonators with interdigital transducer electrodes, are provided in a serial arm. Meanwhile, parallel arm resonators P1 to P3 are provided in respectively different parallel arms. The parallel arm resonators P1 to P3 also include elastic wave resonators with interdigital transducer electrodes.

Figure 2:
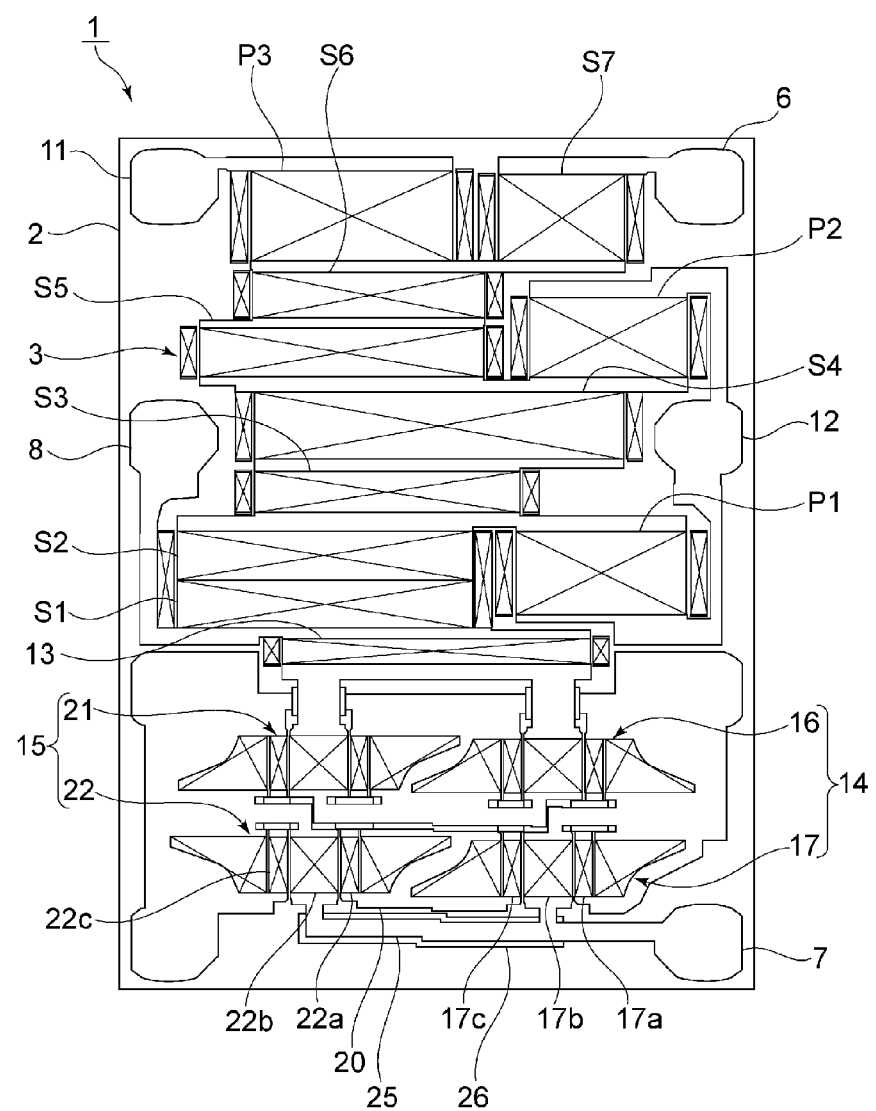
FIG. 2 is a plan view of the duplexer illustrated in FIG. 1.

FIG. 2 illustrates the serial arm resonators S1 to S7 and parallel arm resonators P1 to P3 in a simplified manner. The serial arm resonators S1 to S7 and the parallel arm resonators P1 to P3 are all preferably defined by single-port elastic wave resonators. A single-port elastic wave resonator includes an interdigital transducer electrode and reflectors disposed on both sides of the interdigital transducer electrode in an elastic wave propagation direction thereof. In the present specification, areas in which the interdigital transducer electrodes of such an elastic wave resonator, an elastic wave filter, and so on, are provided, and areas in which the reflectors are provided, are illustrated in a simplified manner by an X enclosed in a rectangle.

Note that an electrode land defining the common node 8 is shown in FIG. 2, and this electrode land also defines and functions as the antenna terminal 5 illustrated in FIG. 1.

Furthermore, in FIG. 2, a ground terminal 12 connected to the parallel arm resonators P1 and P2 and a ground terminal connected to the parallel arm resonator P3 are provided on the piezoelectric substrate 2.

Returning to FIG. 1, the reception filter 4 includes an elastic wave resonator 13, a first filter section 14, and a second filter section 15. The elastic wave resonator 13 is a single-port elastic wave resonator, with one end connected to the common node 8 and another end connected to a node 13A. In the reception filter 4, the common node 8 defines and functions as an input terminal and the reception terminal 7 defines and functions as an output terminal.

The first filter section 14 and the second filter section 15 are connected between the common node 8 and the reception terminal 7. To be more specific, the first filter section 14 and the second filter section 15 are connected in parallel between the node 13A and the reception terminal 7. The first filter section 14 and the second filter section 15 are configured by preferably forming the illustrated electrode structures on the piezoelectric substrate 2 as illustrated in FIG. 2.

As illustrated in FIG. 1, the first filter section 14 includes a first longitudinally coupled resonator-type elastic wave filter unit 16 and a second longitudinally coupled resonator-type elastic wave filter unit 17. The first longitudinally coupled resonator-type elastic wave filter unit 16 and the second longitudinally coupled resonator-type elastic wave filter unit 17 are cascade-connected. In other words, the first filter section 14 has a two-stage cascading connection structure.

The first longitudinally coupled resonator-type elastic wave filter unit 16 and the second longitudinally coupled resonator-type elastic wave filter unit 17 are each defined by three IDT-type elastic wave resonators. The first longitudinally coupled resonator-type elastic wave filter unit 16 includes first to third interdigital transducers 16a to 16c, disposed in order along the elastic wave propagation direction. The second longitudinally coupled resonator-type elastic wave filter unit 17 likewise includes first to third interdigital transducer electrodes 17a to 17c.

One end of the interdigital transducer electrode 16a is connected to a ground potential, and another end is connected to one end of the interdigital transducer electrode 17a by a first inter-stage wiring line 18. Another end of the interdigital transducer electrode 17a is connected to a ground potential. Likewise, one end of the interdigital transducer electrode 16b is connected to the node 13A, and another end is connected to a ground potential. One end of the interdigital transducer electrode 16c is connected to a ground potential, and another end is connected to a second inter-stage wiring line 19. One end of the interdigital transducer electrode 17b is connected to a ground potential, and another end is connected to the reception terminal 7. One end of the interdigital transducer electrode 17c is connected to the second inter-stage wiring line 19. Another end on the reception terminal side is connected to a virtual ground wiring line 20.

In the second filter section 15 as well, a third longitudinally coupled resonator-type elastic wave filter unit and a fourth longitudinally coupled resonator-type elastic wave filter unit 22 have a two-stage cascading connection. The third longitudinally coupled resonator-type elastic wave filter unit 21 includes first to third interdigital transducer electrodes 21a to 21c. The fourth longitudinally coupled resonator-type elastic wave filter unit 22 includes first to third interdigital transducer electrodes 22a to 22c. One end of the first interdigital transducer electrode 21a, on an antenna terminal side, is connected to a ground potential, and another end, on a reception terminal side, is connected to a third inter-stage wiring line 23.

One end of the interdigital transducer electrode 21b is connected to the node 13A, and another end is connected to a ground potential. One end of the interdigital transducer electrode 21c is connected to a ground potential, and another end is connected to a fourth inter-stage wiring line 24. One end of the interdigital transducer electrode 22a is connected to the interdigital transducer electrode 21a by the third inter-stage wiring line 23. Another end of the interdigital transducer electrode 22a, on the reception terminal side, is connected to the virtual ground wiring line 20, and is electrically connected to the other end of the interdigital transducer electrode 17c on the reception terminal side.

One end of the interdigital transducer electrode 22b is connected to a ground potential, and another end is connected to the reception terminal 7. One end of the interdigital transducer electrode 22c is connected to the fourth inter-stage wiring line 24, and another end is connected to a ground potential. The orientations of the interdigital transducer electrodes 16a to 16c and the interdigital transducer electrodes 17a to 17c are set so that the phase of a signal flowing in the first inter-stage wiring line 18 and the phase of a signal flowing in the second inter-stage wiring line 19 are inverse. Likewise, the orientations of the interdigital transducer electrodes 21a to 21c and the interdigital transducer electrodes 22a to 22c are selected so that the phase of a signal flowing in the third inter-stage wiring line 23 and the phase of a signal flowing in the fourth inter-stage wiring line 24 are inverse.

In addition, the phases of the signals flowing in the second inter-stage wiring line 19 and the third inter-stage wiring line 23 are inverse. Accordingly, the phases of signals supplied to the interdigital transducer electrode 17c and the interdigital transducer electrode 22a, which are adjacent between the first and second filter sections 14 and 15, are inverse. On the other hand, an end portion of the interdigital transducer electrode 17c on the side that is to be connected to a ground potential and an end portion of the interdigital transducer electrode 22a on the side that is to be connected to a ground potential are connected by the virtual ground wiring line 20. As described above, the phases of the signals supplied to the interdigital transducer electrode 17c and the interdigital transducer electrode 22a are inverse, and thus the interdigital transducer electrodes 17c and 22a need not be connected to a ground potential as long as the interdigital transducer electrodes 17c and 22a are both connected to the virtual ground wiring line 20, as described above.

Accordingly, as illustrated in FIG. 2, it is not necessary to connect the virtual ground wiring line 20 to a ground terminal in a configuration in which the virtual ground wiring line 20 is provided on the piezoelectric substrate 2. Accordingly, a higher level of miniaturization is achieved.

However, as described above, there has been a problem in that ripples have appeared in the filter characteristics, and particularly in the pass band, in such a configuration in which a virtual ground wiring line is provided. With respect to this, in the duplexer 1 according to the present preferred embodiment, a hot-side wiring portion 25 that is adjacent to the virtual ground wiring line 20 is provided on an insulating film 26, as illustrated in FIG. 2. Accordingly, the ripples are effectively suppressed or prevented. This will be described in further detail hereinafter.

As illustrated in FIG. 2, the hot-side wiring portion is a wiring portion connected to the one end of the interdigital transducer electrode 22b and the one end of the interdigital transducer electrode 17b, and connected to the reception terminal 7. Meanwhile, because the hot-side wiring portion 25 is electrically connected to the end portions of the interdigital transducer electrodes 17b and 22b on the sides thereof connected to the reception terminal 7, the hot-side wiring portion 25 is adjacent to the virtual ground wiring line 20.

In the present application, it was discovered that in a configuration including the virtual ground wiring line 20, disposing the hot-side wiring portion 25, which is adjacent to the virtual ground wiring line 20, on the insulating film 26 effectively suppresses or prevents the ripples, which led to the conception of the present invention. The insulating film 26 is able to be formed using a suitable insulative material capable of electrically insulating the hot-side wiring portion 25 from the piezoelectric substrate 2. A synthetic resin, insulative ceramics, or the like can be used as such an insulative material. Preferably, a polyimide resin or the like is able to be used favorably. In this case, the insulating film 26 is formed with ease.

In addition, in various preferred embodiments of the present invention, the hot-side wiring portion adjacent to the virtual ground wiring line refers to a wiring portion on a hot side closest to the virtual ground wiring line.

Hot refers to a signal line connected to the input terminal, the output terminal, or the like.

Figure 3:
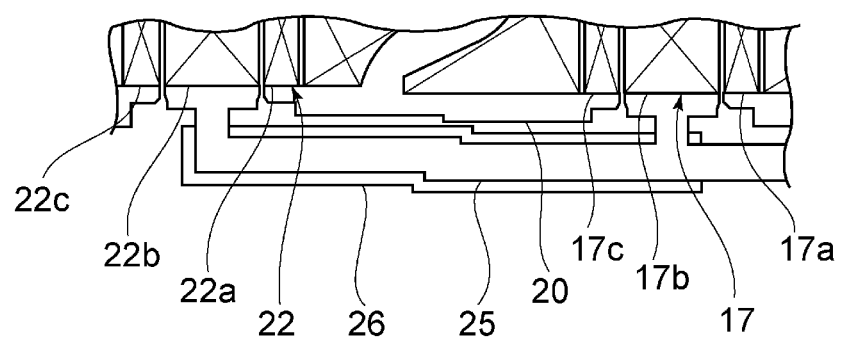
FIG. 3 is a partially cut-out plan view illustrating primary components of the duplexer illustrated in FIG. 2 in an enlarged manner.

As illustrated in FIG. 3, the hot-side wiring portion 25 is parallel or approximately parallel to the virtual ground wiring line 20 in the present preferred embodiment. As a result, a vertical direction dimension in FIG. 2, or in other words, a dimension in the inter-stage connection direction of the first and second filter sections, is able to be significantly reduced. However, the hot-side wiring portion 25 may be provided so as not to be parallel to the virtual ground wiring line 20.

On the other hand, as illustrated in FIG. 3, the hot-side wiring portion 25 need not be located entirely on the insulating film 26, and it is sufficient for the hot-side wiring portion 25 to be located on the insulating film 26 in at least an area adjacent to the virtual ground wiring line 20. In the present preferred embodiment, the hot-side wiring portion 25 is located directly on the piezoelectric substrate 2 on the side closer to the reception terminal 7, past an area where the virtual ground wiring line 20 is provided.

Figure 4:
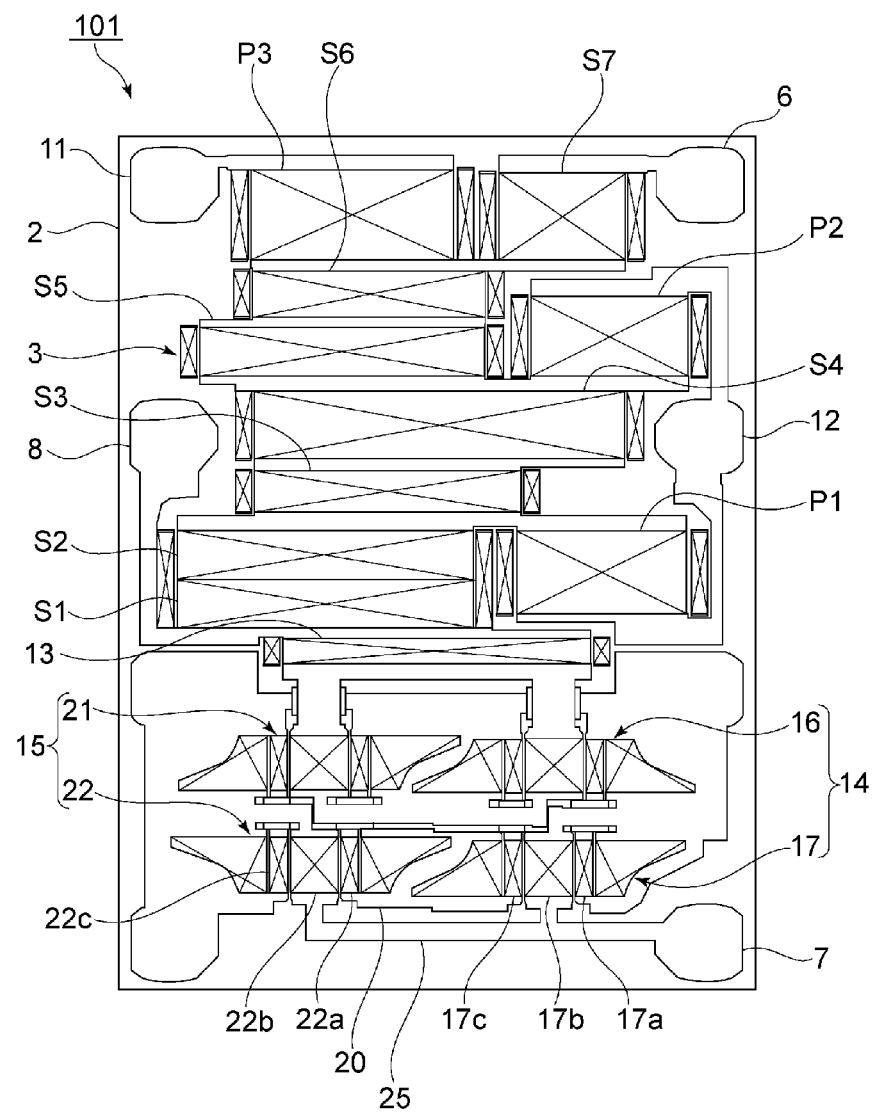
FIG. 4 is a plan view of a duplexer according to a comparative example.
Figure 5:
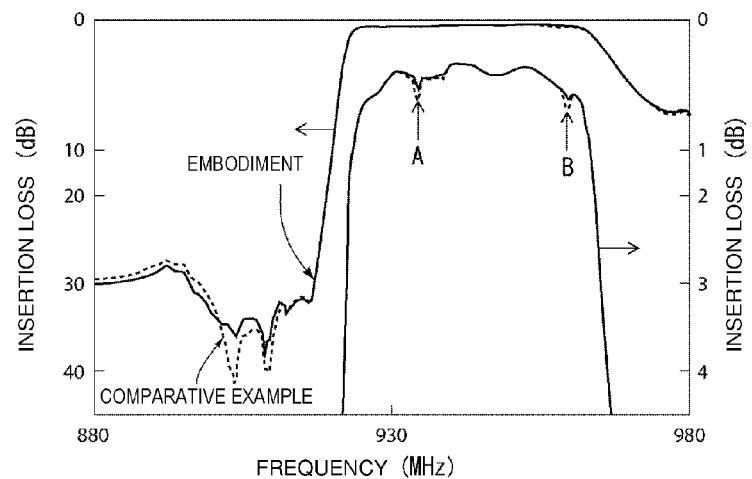
FIG. 5 is a diagram illustrating filter characteristics of a reception filter in a duplexer according to the first preferred embodiment and according to a comparative example.

FIG. 5 is a diagram illustrating filter characteristics of the reception filter 4 according to a preferred embodiment of the present invention and in a comparative example. For comparative purposes, a duplexer according to the comparative example, having an electrode structure as illustrated in the plan view shown in FIG. 4, was prepared. In a duplexer 101 according to the comparative example, the transmission filter 3 was the same as in the present preferred embodiment of the present invention. Meanwhile, aside from the hot-side wiring portion 25 being provided directly on the piezoelectric substrate 2 without providing the insulating film 26, the reception filter is also exactly the same as in the present preferred embodiment.

A solid line in FIG. 5 represents a result of the present preferred embodiment, whereas a broken line represents a result of the comparative example.

As is clear from FIG. 5, in the comparative example, large ripples appear within the pass band, as indicated by arrows A and B. However, it can be seen that according to the present preferred embodiment, such ripples A and B are significantly suppressed.

As described above, in the present preferred embodiment, the ripples A and B in the pass band are significantly suppressed due to the hot-side wiring portion 25 being provided on the insulating film 26. This is thought to be because providing the insulating film 26 reduces parasitic capacitance between the hot-side wiring portion 25 and the virtual ground wiring line 20.

In other words, it is thought that the ripples A and B appear because parasitic capacitance arises between the virtual ground wiring line 20 and the hot-side wiring portion adjacent thereto, and the hot-side signal is transmitted to the virtual ground wiring line 20 through that parasitic capacitance. When such parasitic capacitance is large due to the virtual ground wiring line 20 not being connected to a ground potential, there is a risk that the potential of the virtual ground wiring line 20 will change greatly from 0 V. As a result, a ground terminal-side potential of the interdigital transducer electrode 17c connected to the virtual ground wiring line 20 and a ground terminal-side potential of the interdigital transducer electrode 22a become asymmetrical, which is thought to cause the ripples A and B to appear.

In the present preferred embodiment, providing the insulating film 26 is thought to reduce the parasitic capacitance, which in turn significantly suppresses the ripples A and B.

As such, according to the present preferred embodiment, as described above, not only makes it possible to achieve a higher level of miniaturization using the virtual ground wiring line 20, but also makes it possible to effectively suppress ripples in the pass band.

Figure 6:
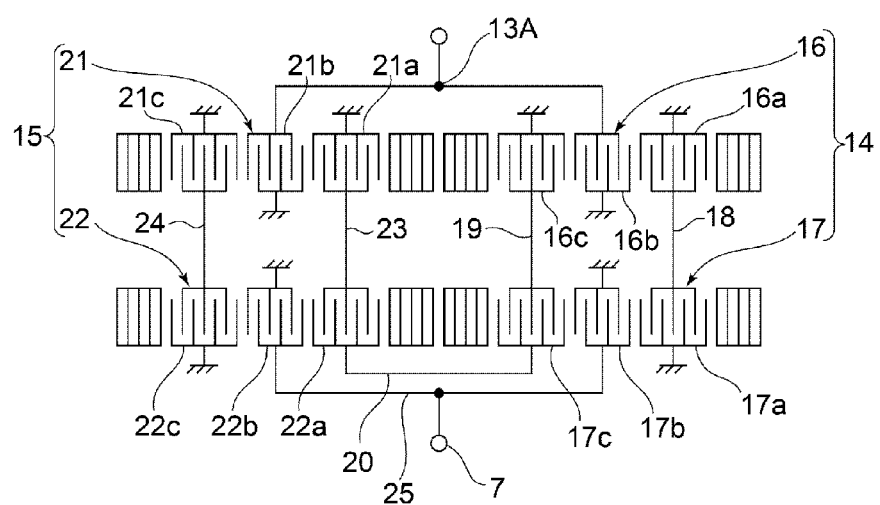
FIG. 6 is a schematic plan view illustrating an electrode structure of a filter device used as a reception filter in the preferred embodiment illustrated in FIG. 1.

FIG. 6 is a schematic plan view illustrating the electrode structure of the reception filter 4 according to a preferred embodiment of the present invention, with the exception of the elastic wave resonator 13. However, the present invention is not limited to a filter device having the electrode structure described in the present preferred embodiment, and can also be applied in a filter device having the electrode structures according to first to fifth variations of preferred embodiments of the present invention illustrated in FIGS. 7 to 11.

Figure 7:
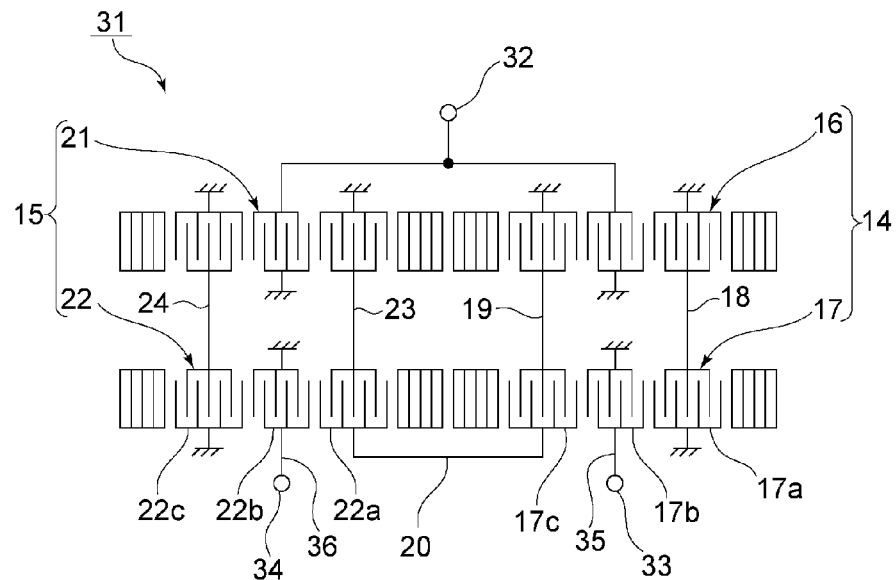
FIG. 7 is a schematic plan view illustrating a first variation on an electrode structure in a filter device in which a preferred embodiment of the present invention is applied.

A filter device 31 illustrated in FIG. 7 includes an input terminal 32 and a pair of balanced terminals 33 and 34 defining and functioning as output terminals. In other words, the filter device 31 is a balanced filter device including the pair of balanced terminals 33 and 34. In this manner, various preferred embodiments and multiple variations of preferred embodiments of the present invention can also be applied in a balanced filter device.

As illustrated in FIG. 7, in the filter device 31, one end of the interdigital transducer electrode 17b in the second longitudinally coupled resonator-type elastic wave filter unit of the first filter section 14 is connected to the first balanced terminal 33. Meanwhile, one end of the interdigital transducer electrode 22b in the fourth longitudinally coupled resonator-type elastic wave filter unit 22 is connected to the second balanced terminal 34. In other words, the first filter section 14 and the second filter section 15 are electrically connected in series through a ground potential between the balanced terminals 33 and 34. Other configurations are the same as the electrode structure and so on in which the first filter section 14 and the second filter section 15 are electrically connected in parallel with respect to unbalanced terminals illustrated in FIG. 6.

According to this variation of a preferred embodiment of the present invention, the virtual ground wiring line 20 enables miniaturization to be achieved. Meanwhile, according to the present variation of a preferred embodiment of the present invention, the hot-side wiring portion adjacent to the virtual ground wiring line 20 corresponds to a hot-side wiring portion 35 that connects the interdigital transducer electrode 17b and the first balanced terminal 33 and a hot-side wiring portion 36 that connects the interdigital transducer electrode 22b and the second balanced terminal 34. In other words, it is sufficient for the hot-side wiring portions 35 and 36 to be provided on an insulating layer. As described above, in such a balanced filter device, large ripples appear in the phase difference and amplitude difference characteristics between the pair of balanced terminals. However, according to this variation of a preferred embodiment of the present invention, positioning the hot-side wiring portions 35 and 36 on the insulating film makes it possible to effectively suppress or prevent such ripples in the same manner as in the preferred embodiments of the present invention described above.

Figure 8:
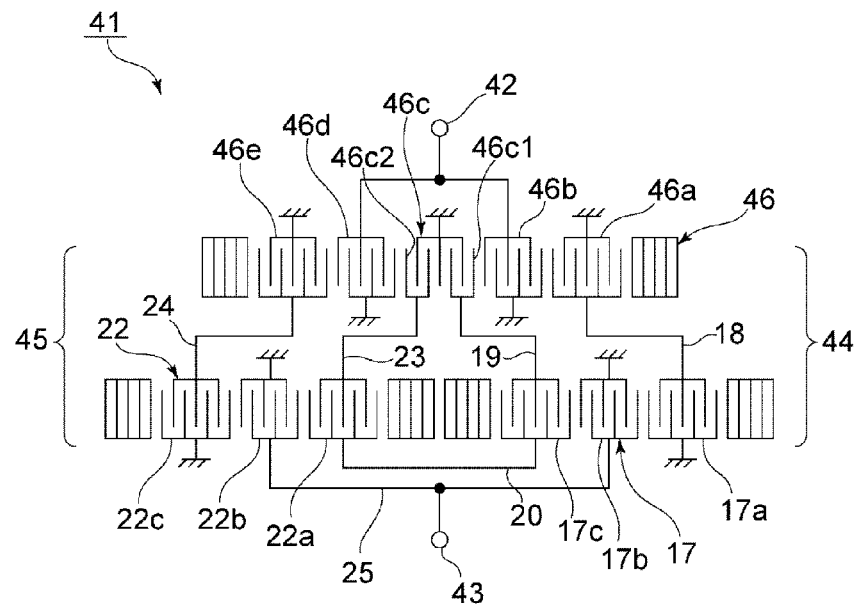
FIG. 8 is a schematic plan view illustrating a second variation on an electrode structure in a filter device in which a preferred embodiment of the present invention is applied.

In a filter device 41 illustrated in FIG. 8, a first filter section 44 and a second filter section 45 are connected in parallel between an input terminal 42 and an output terminal 43. Here, first and third longitudinally coupled resonator-type elastic wave filter units of the first filter section 44 and the second filter section 45 are integrated as a five IDT-type longitudinally coupled resonator-type elastic wave filter unit 46.

In other words, the longitudinally coupled resonator-type elastic wave filter unit 46 includes first to fifth interdigital transducer electrodes 46a to 46e. The interdigital transducer electrode 46c in the center is divided into two portions in the elastic wave propagation direction. In other words, the interdigital transducer electrode 46c includes divided interdigital transducer portions 46c1 and 46c2. The divided interdigital transducer portions 46c1 and 46c2 are connected to the second and third inter-stage wiring lines 19 and 23, respectively. In addition, the interdigital transducer electrode 46a is connected to the first inter-stage wiring line 18 and the interdigital transducer electrode 46e is connected to the fourth inter-stage wiring line 24. The rest of the configuration is almost the same as the electrode structure illustrated in FIG. 7.

According to the present variation of a preferred embodiment of the present invention as well, positioning the hot-side wiring portion 25 that is adjacent to the virtual ground wiring line 20 upon the insulating layer makes it possible to achieve the same effects as in the preferred embodiments of the present invention described above.

Figure 9:
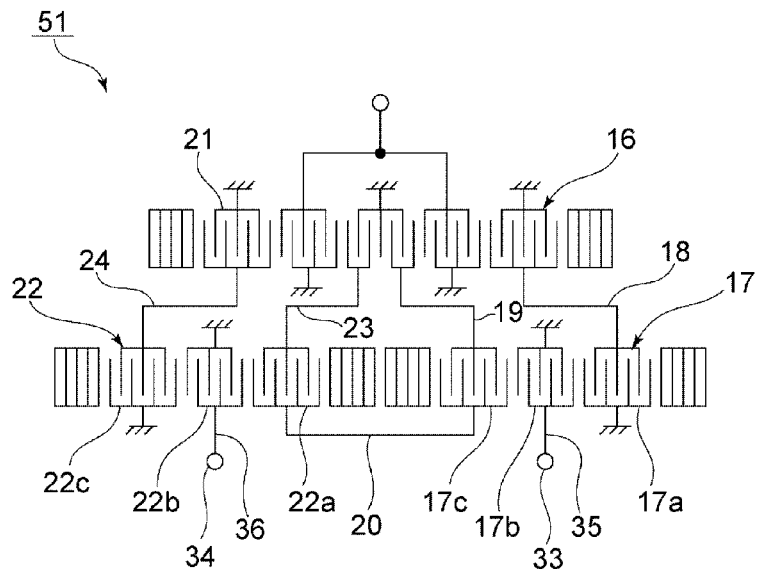
FIG. 9 is a schematic plan view illustrating a third variation on an electrode structure in a filter device in which a preferred embodiment of the present invention is applied.

A filter device 51 according to a third variation of a preferred embodiment of the present invention illustrated in FIG. 9 is, when viewed from an unbalanced terminal, almost the same as the filter device 41, which has a configuration in which the first filter section and the second filter section are electrically connected to each other in parallel. What differs is that the first filter section and the second filter section are electrically connected in series through a ground potential by the interdigital transducer electrodes 17b and 22b between the hot-side wiring portions 35 and 36 connected to the balanced terminals 33 and 34, as in the filter device 31 illustrated in FIG. 7. In other words, a balanced filter device 51 is configured. According to the present variation of a preferred embodiment of the present invention as well, providing the hot-side wiring portions 35 and 36 that are adjacent to the virtual ground wiring line 20 upon the insulating layer makes it possible to suppress or prevent the filter characteristics result. In other words, ripples appearing in the phase difference and amplitude difference characteristics between the pair of balanced terminals 33 and 34 are effectively suppressed or prevented.

Figure 10:
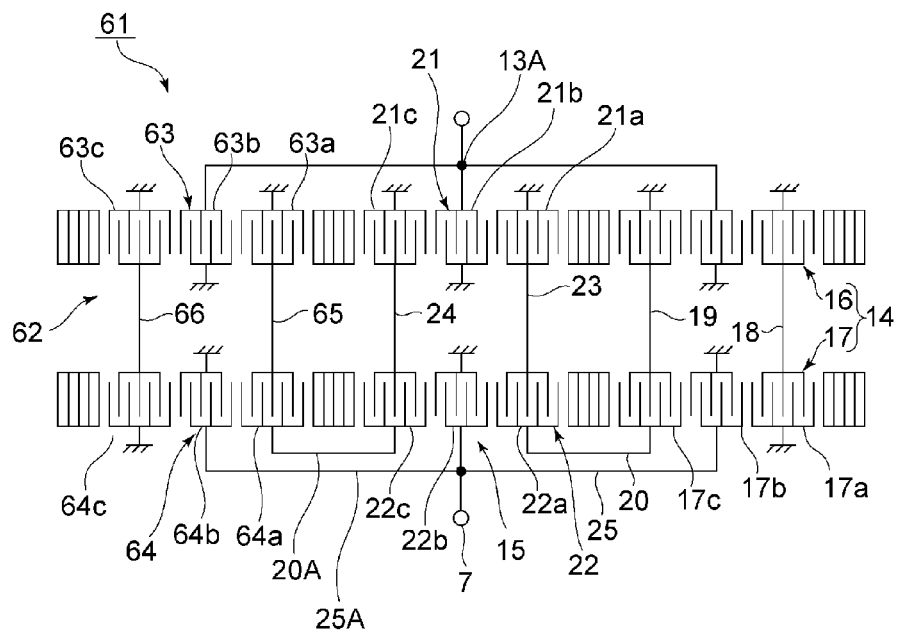
FIG. 10 is a schematic plan view illustrating a fourth variation on an electrode structure in a filter device in which a preferred embodiment of the present invention is applied.

In a filter device 61 according to a fourth variation of a preferred embodiment of the present invention illustrated in FIG. 10, a third filter section 62 is further provided in a horizontal direction in addition to the first and second filter sections 14 and 15. The third filter section 62 has the same configuration as the first filter section 14. In other words, the third filter section 62 has a structure in which a fifth longitudinally coupled resonator-type elastic wave filter unit and a sixth longitudinally coupled resonator-type elastic wave filter unit 64 have a two-stage cascading connection.

One end of an interdigital transducer electrode 63b is connected to the node 13A, and another end is connected to a ground potential. One end each of interdigital transducer electrodes 63a and 63c are connected to a ground potential. Other ends of the interdigital transducers 63a and 63c are connected to fifth and sixth inter-stage wiring lines 65 and 66, respectively.

One end of an interdigital transducer electrode 64b is connected to a ground potential, and another end is connected to the reception terminal 7. One end of an interdigital transducer electrode 64a is connected to the fifth inter-stage wiring line 65, and another end is connected to a virtual ground 20A. The virtual ground wiring line 20A is connected to the interdigital transducer electrode 22c of the second filter section 15. One end of an interdigital transducer electrode 64c is connected to a ground potential, and another end is connected to the sixth inter-stage wiring line 66.

In the filter device 61, the orientations of the interdigital transducer electrodes 63a to 63c and the interdigital transducer electrodes 64a to 64c are selected so that the phase of a signal flowing in the fifth inter-stage wiring line 65 and the phase of a signal flowing in the sixth inter-stage wiring line 66 are inverse. In addition, the phase of the signal flowing in the fifth inter-stage wiring line 65 and the phase of the signal flowing in the fourth inter-stage wiring line 24 are inverse.

Accordingly, the virtual ground wiring line 20A functions in the same manner as the virtual ground wiring line 20. As such, according to this variation as well, providing the virtual ground wiring line 20A in addition to the virtual ground wiring line 20 enables miniaturization to be achieved. Furthermore, ripples appearing in the filter characteristics are reduced by positioning the hot-side wiring portion 25 that is adjacent to the virtual ground wiring line 20 and a hot-side wiring portion 25A that is similarly adjacent to the virtual ground wiring line 20A upon the same insulating layer or separate insulating layers.

Figure 11:
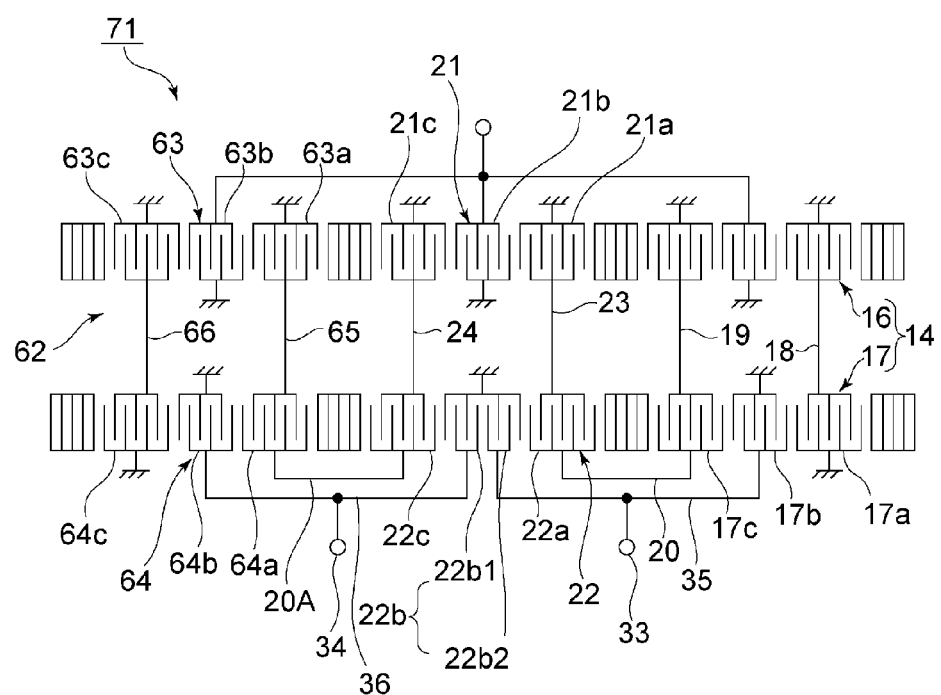
FIG. 11 is a schematic plan view illustrating a fifth variation on an electrode structure in a filter device in which a preferred embodiment of the present invention is applied.

A filter device 71 according to a fifth variation of a preferred embodiment of the present invention illustrated in FIG. 11 is similar to the filter device 61, aside from being changed to a balanced type. In other words, in the filter device 71, the interdigital transducer electrode 22b includes divided interdigital transducer portions 22b1 and 22b2. The divided interdigital transducer portion 22b2 and the interdigital transducer electrode 17b are connected in common, and are connected to the first balanced terminal 33. Likewise, the divided interdigital transducer portion 22b1 and the interdigital transducer electrode 64b are connected in common, and are connected to the second balanced terminal 34.

According to the present variation of a preferred embodiment of the present invention as well, the virtual ground wiring lines 20 and 20A enable miniaturization to be achieved. In addition, by positioning the hot-side wiring portions, that is, by positioning the hot-side wiring portion 35 that is adjacent to the virtual ground wiring line 20 upon an insulating layer and the hot-side wiring portion 36 that is adjacent to the virtual ground wiring line 20A upon the insulating layer, ripples are suppressed. In other words, ripples appearing in the phase characteristics and amplitude characteristics between the first and second balanced terminals 33 and 34 are effectively suppressed.

Figure 12:
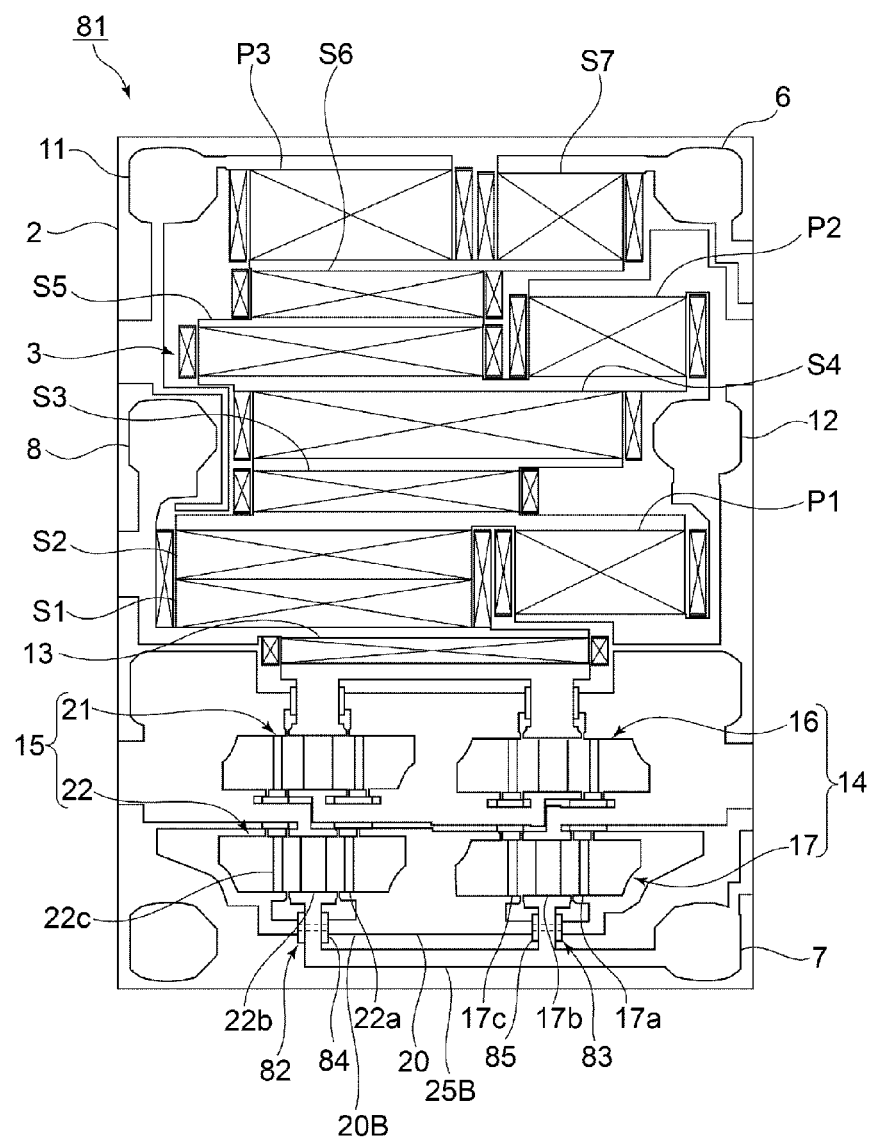
FIG. 12 is a plan view illustrating a duplexer according to a second preferred embodiment of the present invention.

FIG. 12 is a plan view illustrating a duplexer according to a second preferred embodiment of the present invention. In a duplexer 81, a hot-side wiring portion 25B in which the interdigital transducer electrodes 17b and 22b are connected to the reception terminal 7 bridges a virtual ground wiring line 20B using bridging portions 82 and 83. To be more specific, interlayer insulating films 84 and 85 are provided on the virtual ground wiring line 20B. The hot-side wiring portion 25B is constructed such that the tops of the interlayer insulating films 84 and 85 are inverted. The bridging portions 82 and 83 are provided as a result.

Figure 13:
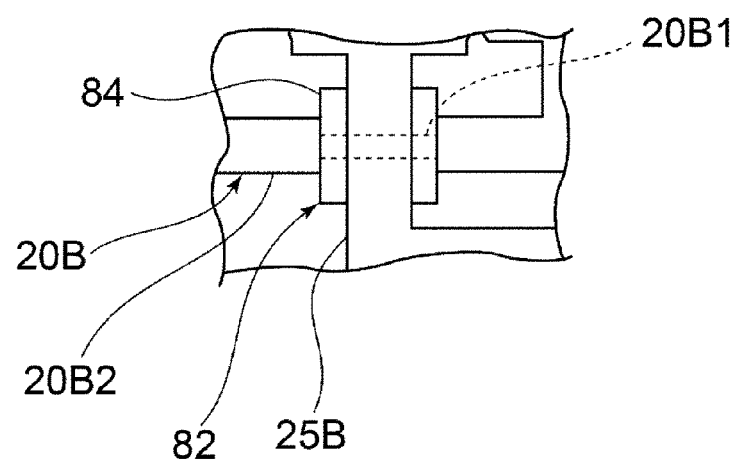
FIG. 13 is a partially cut-out plan view illustrating primary components of the duplexer illustrated in FIG. 12.

As illustrated in the enlargement in FIG. 13, the virtual ground wiring line 20B has a portion 20B1, whose width is relatively narrow, in the bridging portion 82. The portion 20B1 whose width is relatively narrow is in the present preferred embodiment provided in a portion laminated on the interlayer insulating film 84. A width of a portion 20B2, aside from the portion 20B1 whose width is relatively narrow, is made relatively wide.

The present preferred embodiment differs from the first preferred embodiment in that the bridging portions 82 and are provided and the hot-side wiring portion 25B is positioned on the interlayer insulating films 84 and 85 in the bridging portions 82 and 83. Note that the same elements will be given the same reference numerals as those in the first preferred embodiment, and the descriptions of the first preferred embodiment will be applied here.

In the present preferred embodiment as well, miniaturization is achieved by using the virtual ground wiring line 20B. Furthermore, in the present preferred embodiment, the hot-side wiring portion 25B is isolated from the virtual ground wiring line 20B by the interlayer insulating films 84 and 85. Accordingly, parasitic capacitance between the virtual ground wiring line 20B and the hot-side wiring portion 25B are reduced. Accordingly, ripples appearing in the pass band are suppressed in the same manner as in the first preferred embodiment.

In particular, in the present preferred embodiment, an area that overlaps with the hot-side wiring portion 25B with the interlayer insulating film 84 interposed therebetween is the portion 20B1 whose width is narrow, thus configuring the virtual ground wiring line 20B. Accordingly, the parasitic capacitance is even further reduced. Accordingly, the ripples are even more effectively suppressed. In this manner, it is desirable for the width of the area of the virtual ground wiring line that overlaps with the hot-side wiring portion 25B with the interlayer insulating films 84 and 85 interposed therebetween to be narrower than the remaining areas thereof.

Although the present preferred embodiment describes the entire area of the virtual ground wiring line located below the interlayer insulating film 84 as being the portion 20B1 whose width is narrow, the width of the virtual ground wiring line 20B may be narrowed only in an area that overlaps with the hot-side wiring portion 25B, as described above. Furthermore, the portion 20B1 whose width is narrow may extend further to an outer side portion than the area where the interlayer insulating film 84 is laminated.

Figure 14:
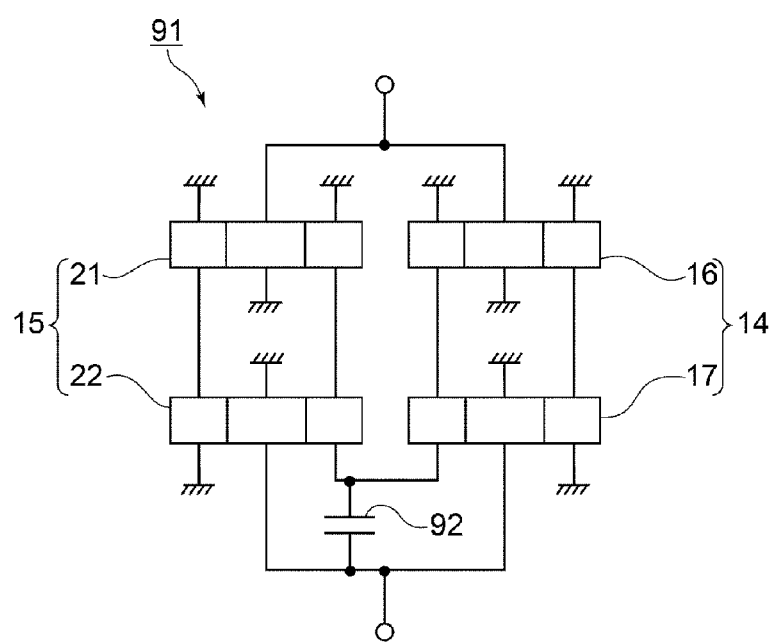
FIG. 14 is a diagram illustrating a filter configuration according to a comparative example, compared to the second preferred embodiment of the present invention.

FIG. 14 illustrates a filter configuration according to a comparative example, in which an electrostatic capacitance at about 0.1 pF has been added between the virtual ground wiring line and the hot-side wiring portion. Other configurations of the present comparative example are almost the same as in the second preferred embodiment.

Figure 15:
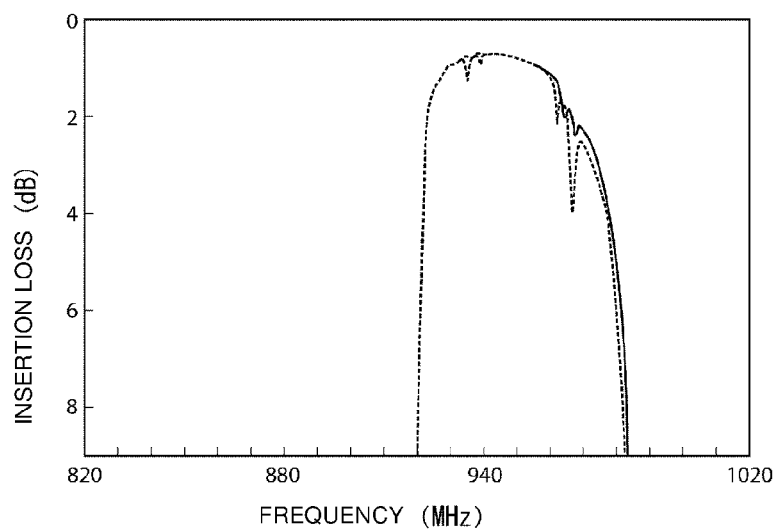
FIG. 15 is a diagram illustrating filter characteristics of a reception filter in a duplexer according to the second preferred embodiment and according to a comparative example.

FIG. 15 illustrates results of measuring S21 characteristics according to the second preferred embodiment and the comparative example illustrated in FIG. 14. In FIG. 15, the second preferred embodiment is represented by a solid line and the comparative example of FIG. 14 is represented by a broken line.

It can be seen that in the comparative example, compared to the second preferred embodiment of the present invention, ripples increase in the pass band as the electrostatic capacitance between the virtual ground wiring line and the hot-side wiring portion increases.

It can therefore be seen that according to the second preferred embodiment of the present invention, the electrostatic capacitance between the virtual ground wiring line and the hot-side wiring portion is reduced, and thus ripples in the pass band are reduced.

The electrode structures in the first and second filter sections are not particularly limited in the filter device according to the second preferred embodiment of the present invention as well, and can be varied as appropriate as per the aforementioned first to fifth variations of preferred embodiments of the present invention illustrated in FIGS. 7 to 11.

Furthermore, in the first preferred embodiment, the virtual ground wiring line 20 that connects the interdigital transducer electrode 17c and the interdigital transducer electrode 22a is provided, and in the second preferred embodiment, the virtual ground wiring line 20B that connects the interdigital transducer electrodes 17a, 17c, 22a, and 22c is provided. In the present invention, the interdigital transducer electrodes connected to the virtual ground wiring line are not limited thereto. In other words, in the first to fourth longitudinally coupled resonator-type elastic wave filter units, one end and other end portions are provided in the interdigital transducer electrodes, with a terminal portion connected to a hot-side potential serving as a first terminal portion and a terminal portion connected to a potential that is not the hot-side potential defining and functioning as a second terminal portion. In various preferred embodiments of the present invention, it is sufficient for the virtual ground wiring line to be provided so that at least one of the second terminal portions in the first filter section and at least one of the plurality of second terminal portions in the second filter section are connected.

Note that the aforementioned preferred embodiments describe a configuration in which the first filter section and the second filter section are electrically connected in parallel when viewed from an unbalanced terminal on at least one of the input terminal and output terminal sides. The configuration does not exclude the first filter section and the second filter section being electrically connected in series through a ground potential between the balanced terminals on at least one of the input terminal and the output terminal sides, as indicated in the preferred embodiments. Preferred embodiments of the present invention can also be applied in a longitudinally coupled resonator-type elastic wave filter unit including three or more interdigital transducers, including a three IDT-type elastic wave resonator.

In addition, the filter devices according to various preferred embodiments of the present invention can be constituted of a device that uses a variety of elastic waves, such as elastic surface acoustic waves, boundary acoustic waves, and so on.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
    a piezoelectric substrate;
    an input terminal and an output terminal;
    a first filter section provided on the piezoelectric substrate and connected between the input terminal and the output terminal; and
    a second filter section provided on the piezoelectric substrate, connected between the input terminal and the output terminal, and connected in parallel to the first filter section; wherein
    the first filter section includes a first interdigital transducer (IDT) electrode, a first longitudinally coupled resonator-type elastic wave filter unit, a second longitudinally coupled resonator-type elastic wave filter unit cascade-connected to the first longitudinally coupled resonator-type elastic wave filter unit, and first and second inter-stage wiring lines that connect the first longitudinally coupled resonator-type elastic wave filter unit and the second longitudinally coupled resonator-type elastic wave filter unit;
    the second filter section includes a second IDT electrode, a third longitudinally coupled resonator-type elastic wave filter unit, a fourth longitudinally coupled resonator-type elastic wave filter unit cascade-connected to the third longitudinally coupled resonator-type elastic wave filter unit, and third and fourth inter-stage wiring lines that connect the third and fourth longitudinally coupled resonator-type elastic wave filter units;
    a side of the first IDT electrode is connected to the second inter-stage wiring line and a side of the second IDT electrode is connected to the third inter-stage wiring line such that phases of signals that propagate through the second and third inter-stage wiring lines are inverse to one another;
    the first filter section and the second filter section include a plurality of first terminal portions connected to a hot-side potential and a plurality of second terminal portions connected to a potential that is not the hot-side potential;
    another side of the first IDT electrode includes one of the plurality of second terminal portions of the first filter section;
    another side of the second IDT electrode includes one of the plurality of second terminal portions of the second filter section; and
    the filter device further includes:
        a virtual ground wiring line that connects at least one of the plurality of second terminal portions in the first filter section and at least one of the plurality of second terminal portions in the second filter section;
        a hot-side wiring portion that is adjacent to the virtual ground wiring line; and
        an insulating film provided on the piezoelectric substrate; wherein
    the hot-side wiring portion that is adjacent to the virtual ground wiring line is located on the insulating film; and
    the virtual ground wiring line is connected to the second terminal portion of the first IDT electrode and the second terminal portion of the second IDT electrode.

2. The filter device according to claim 1, wherein the virtual ground wiring line electrically connects at least one of the second terminal portions in the second longitudinally coupled resonator-type elastic wave filter unit and at least one of the second terminal portions in the fourth longitudinally coupled resonator-type elastic wave filter unit.

3. The filter device according to claim 1, wherein the input terminal is an unbalanced input terminal and the output terminal is an unbalanced output terminal.

4. The filter device according to claim 1, wherein the input terminal is an unbalanced input terminal and the output terminal is first and second balanced output terminals.

5. The filter device according to claim 1, further comprising:
    at least one third filter section connected between the input terminal and the output terminal and connected in parallel to the first and second filter sections.

6. A duplexer comprising:
    a first band-pass filter device including the filter device according to claim 1; and
    a second band-pass filter device, provided on the piezoelectric substrate, that is different from the first band-pass filter device.

7. The duplexer according to claim 6, wherein the virtual ground wiring line electrically connects at least one of the second terminal portions in the second longitudinally coupled resonator-type elastic wave filter unit and at least one of the second terminal portions in the fourth longitudinally coupled resonator-type elastic wave filter unit.

8. The duplexer according to claim 6, wherein the input terminal is an unbalanced input terminal and the output terminal is an unbalanced output terminal.

9. The duplexer according to claim 6, wherein the input terminal is an unbalanced input terminal and the output terminal is first and second balanced output terminals.

10. The duplexer according to claim 6, further comprising:
    at least one third filter section connected between the input terminal and the output terminal and connected in parallel to the first and second filter sections.

* * * * *